United States Patent
Farrar et al.

(10) Patent No.: US 7,164,188 B2
(45) Date of Patent: Jan. 16, 2007

(54) BURIED CONDUCTOR PATTERNS FORMED BY SURFACE TRANSFORMATION OF EMPTY SPACES IN SOLID STATE MATERIALS

(75) Inventors: Paul A. Farrar, South Burlington, VT (US); Joseph Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/940,792

(22) Filed: Aug. 29, 2001

(65) Prior Publication Data

US 2002/0070419 A1 Jun. 13, 2002

Related U.S. Application Data

(62) Division of application No. 09/734,547, filed on Dec. 13, 2000, now Pat. No. 6,383,924.

(51) Int. Cl.
*H01L 29/00* (2006.01)

(52) U.S. Cl. .......................... 257/621; 257/41; 257/44

(58) Field of Classification Search ................ 257/301, 257/41, 44, 621
See application file for complete search history.

(56) References Cited

U.S. PATENT DOCUMENTS

| | | | |
|---|---|---|---|
| 3,497,455 A | 2/1970 | Ahr | |
| 4,241,359 A | 12/1980 | Izumi et al. | |
| 4,314,595 A | 2/1982 | Yamamoto et al. | |
| 4,397,075 A * | 8/1983 | Fatula et al. | 257/301 |
| 4,589,928 A | 5/1986 | Dalton | |
| 4,661,202 A * | 4/1987 | Ochii | 438/621 |
| 4,717,681 A | 1/1988 | Curran | |
| 4,756,956 A | 7/1988 | Nagai et al. | |
| 4,763,179 A * | 8/1988 | Tsubouchi et al. | 148/DIG. 14 |
| 4,962,051 A | 10/1990 | Liaw | |
| 4,962,058 A | 10/1990 | Cronin et al. | |
| 4,992,321 A | 2/1991 | Kandachi et al. | |
| 5,055,426 A | 10/1991 | Manning | |
| 5,098,852 A | 3/1992 | Niki et al. | |

(Continued)

FOREIGN PATENT DOCUMENTS

EP 434984 9/1991

(Continued)

OTHER PUBLICATIONS

F.A. Nichols, et al.—"Surface- (Interface-) and Volume-Diffusion Contributions to Morphological Changes Driven by Capillarity," Transactions of the Metallurgical Society of AIME, vol. 233, Oct. 1965, pp. 1840-1848*.

(Continued)

*Primary Examiner*—Eugene Lee
(74) *Attorney, Agent, or Firm*—Dickstein Shapiro LLP

(57) ABSTRACT

A plurality of buried conductors and/or buried plate patterns formed within a monocrystalline substrate is disclosed. A plurality of empty-spaced buried patterns are formed by drilling holes in the monocrystalline substrate and annealing the monocrystalline substrate to form empty-spaced patterns of various geometries. The empty-spaced patterns are then connected through vias with surfaces of the monocrystalline substrate. The empty-spaced patterns and their respective vias are subsequently filled with conductive materials.

30 Claims, 9 Drawing Sheets

U.S. PATENT DOCUMENTS

| | | | |
|---|---|---|---|
| 5,110,754 A | 5/1992 | Lowrey et al. | |
| 5,112,771 A * | 5/1992 | Ishii et al. | 257/E29.346 |
| 5,160,987 A * | 11/1992 | Pricer et al. | 257/303 |
| 5,176,789 A * | 1/1993 | Yamazaki et al. | 427/586 |
| 5,250,459 A | 10/1993 | Lee | |
| 5,291,438 A * | 3/1994 | Witek et al. | 365/149 |
| 5,306,942 A * | 4/1994 | Fujii | 257/508 |
| 5,404,029 A | 4/1995 | Husher et al. | |
| 5,426,061 A | 6/1995 | Sopori | |
| 5,443,661 A | 8/1995 | Oguro et al. | |
| 5,449,630 A * | 9/1995 | Lur et al. | 438/386 |
| 5,461,243 A | 10/1995 | Ek et al. | |
| 5,471,180 A | 11/1995 | Brommer et al. | |
| 5,510,298 A * | 4/1996 | Redwine | 438/622 |
| 5,526,449 A | 6/1996 | Meade et al. | |
| 5,527,739 A | 6/1996 | Parrillo et al. | |
| 5,565,697 A * | 10/1996 | Asakawa et al. | 257/347 |
| 5,583,368 A * | 12/1996 | Kenney | 257/621 |
| 5,599,745 A | 2/1997 | Reinberg | |
| 5,629,226 A * | 5/1997 | Ohtsuki | 257/E29.343 |
| 5,639,684 A | 6/1997 | Kwok | |
| 5,646,053 A | 7/1997 | Schepis | |
| 5,661,044 A | 8/1997 | Holland et al. | |
| 5,662,768 A * | 9/1997 | Rostoker | 216/39 |
| 5,679,475 A * | 10/1997 | Yamagata et al. | 428/304.4 |
| 5,691,230 A | 11/1997 | Forbes | |
| 5,739,796 A | 4/1998 | Jasper, Jr. et al. | |
| 5,759,898 A | 6/1998 | Ek et al. | |
| 5,773,152 A | 6/1998 | Okonogi | |
| 5,789,859 A | 8/1998 | Watkins et al. | |
| 5,798,559 A | 8/1998 | Bothra | |
| 5,811,870 A | 9/1998 | Bhattacharyya et al. | |
| 5,834,824 A | 11/1998 | Shepherd et al. | |
| 5,840,590 A | 11/1998 | Myers, Jr. et al. | |
| 5,858,869 A | 1/1999 | Chen et al. | |
| 5,861,340 A * | 1/1999 | Bai et al. | 438/592 |
| 5,866,204 A | 2/1999 | Robbie et al. | |
| 5,879,996 A | 3/1999 | Forbes | |
| 5,903,041 A | 5/1999 | La Fleur et al. | |
| 5,920,121 A | 7/1999 | Forbes et al. | |
| 5,943,581 A * | 8/1999 | Lu et al. | 438/243 |
| 5,953,625 A | 9/1999 | Bang | |
| 5,962,910 A | 10/1999 | Hawley et al. | |
| 5,963,817 A | 10/1999 | Chu et al. | |
| 5,963,838 A | 10/1999 | Yamamoto et al. | |
| 5,969,983 A | 10/1999 | Thakur et al. | |
| 5,973,380 A | 10/1999 | Cutter et al. | |
| 5,994,776 A | 11/1999 | Fang et al. | |
| 5,997,378 A | 12/1999 | Dynka et al. | |
| 5,999,308 A | 12/1999 | Nelson et al. | |
| 6,001,711 A | 12/1999 | Hashimoto | |
| 6,013,970 A | 1/2000 | Nishiwaki et al. | |
| 6,016,000 A | 1/2000 | Moslehi | |
| 6,016,001 A | 1/2000 | Sanchez et al. | |
| 6,022,793 A | 2/2000 | Wijaranakula et al. | |
| 6,054,808 A | 4/2000 | Watkins et al. | |
| 6,057,224 A | 5/2000 | Bothra | |
| 6,069,064 A | 5/2000 | Cutter et al. | |
| 6,075,640 A | 6/2000 | Nelson | |
| 6,077,792 A | 6/2000 | Farrar | |
| 6,083,324 A | 7/2000 | Henley et al. | |
| 6,084,814 A | 7/2000 | Casper et al. | |
| 6,088,282 A | 7/2000 | Loughmiller et al. | |
| 6,090,647 A * | 7/2000 | Grass | 438/151 |
| 6,093,623 A | 7/2000 | Forbes | |
| 6,093,624 A | 7/2000 | Letavic et al. | |
| 6,097,077 A | 8/2000 | Gordon et al. | |
| 6,100,176 A | 8/2000 | Forbes et al. | |
| 6,113,758 A | 9/2000 | De Nora et al. | |
| 6,121,126 A | 9/2000 | Ahn et al. | |
| 6,121,659 A * | 9/2000 | Christensen et al. | 257/347 |
| 6,127,777 A | 10/2000 | Watkins et al. | |
| 6,136,666 A | 10/2000 | So | |
| 6,139,626 A | 10/2000 | Norris et al. | |
| 6,146,925 A | 11/2000 | Dennison | |
| 6,171,923 B1 * | 1/2001 | Chi et al. | 438/386 |
| 6,172,456 B1 | 1/2001 | Cathey et al. | |
| 6,174,784 B1 | 1/2001 | Forbes | |
| 6,202,065 B1 | 3/2001 | Wills | |
| 6,204,145 B1 | 3/2001 | Noble | |
| 6,206,065 B1 | 3/2001 | Robbie et al. | |
| 6,214,686 B1 * | 4/2001 | Divakaruni et al. | 438/386 |
| 6,215,158 B1 * | 4/2001 | Choi | 257/368 |
| 6,218,693 B1 * | 4/2001 | Lu | 257/296 |
| 6,228,694 B1 | 5/2001 | Doyle et al. | |
| 6,239,187 B1 | 5/2001 | Hatke et al. | |
| 6,248,422 B1 | 6/2001 | Robbie et al. | |
| 6,251,751 B1 | 6/2001 | Chu et al. | |
| 6,252,293 B1 | 6/2001 | Seyyedy et al. | |
| 6,255,156 B1 | 7/2001 | Forbes et al. | |
| 6,261,876 B1 | 7/2001 | Crowder et al. | |
| 6,271,079 B1 * | 8/2001 | Wei et al. | 438/239 |
| 6,271,566 B1 * | 8/2001 | Tsuchiaki | 257/347 |
| 6,274,460 B1 | 8/2001 | Delgado et al. | |
| 6,277,728 B1 | 8/2001 | Ahn | |
| 6,284,675 B1 | 9/2001 | Jin et al. | |
| 6,288,437 B1 | 9/2001 | Forbes et al. | |
| 6,291,871 B1 | 9/2001 | Dennison | |
| 6,294,420 B1 * | 9/2001 | Tsu et al. | 438/239 |
| 6,309,950 B1 | 10/2001 | Forbes | |
| 6,315,826 B1 | 11/2001 | Muramatsu | |
| 6,323,536 B1 | 11/2001 | Cutter et al. | |
| 6,338,805 B1 | 1/2002 | Anderson | |
| 6,339,011 B1 | 1/2002 | Gonzalez et al. | |
| 6,344,373 B1 | 2/2002 | Bhattacharyya et al. | |
| 6,351,425 B1 | 2/2002 | Porter | |
| 6,368,938 B1 | 4/2002 | Usenko | |
| 6,376,336 B1 | 4/2002 | Buynoski | |
| 6,377,070 B1 | 4/2002 | Forbes | |
| 6,383,924 B1 | 5/2002 | Farrar et al. | |
| 6,387,824 B1 | 5/2002 | Aoi et al. | |
| 6,391,738 B1 | 5/2002 | Moore | |
| 6,423,582 B1 | 7/2002 | Fischer et al. | |
| 6,423,613 B1 | 7/2002 | Geusic | |
| 6,424,001 B1 | 7/2002 | Forbes et al. | |
| 6,436,187 B1 | 8/2002 | Patel et al. | |
| 6,437,403 B1 * | 8/2002 | Noguchi | 257/347 |
| 6,444,534 B1 | 9/2002 | Maszara | |
| 6,444,558 B1 | 9/2002 | Cutter et al. | |
| 6,448,601 B1 | 9/2002 | Forbes et al. | |
| 6,452,713 B1 | 9/2002 | White | |
| 6,456,149 B1 | 9/2002 | Cutter et al. | |
| 6,458,630 B1 | 10/2002 | Daubenspeck et al. | |
| 6,461,933 B1 | 10/2002 | Houston | |
| 6,478,883 B1 | 11/2002 | Tamatsuka et al. | |
| 6,495,395 B1 | 12/2002 | Reinberg | |
| 6,495,454 B1 * | 12/2002 | Livengood et al. | 438/667 |
| 6,496,034 B1 | 12/2002 | Forbes et al. | |
| 6,498,056 B1 | 12/2002 | Motsiff et al. | |
| 6,509,623 B1 | 1/2003 | Zhao | |
| 6,525,399 B1 | 2/2003 | Cutter et al. | |
| 6,531,727 B1 | 3/2003 | Forbes et al. | |
| 6,538,330 B1 | 3/2003 | Forbes | |
| 6,541,356 B1 | 4/2003 | Fogel et al. | |
| 6,541,811 B1 | 4/2003 | Thakur et al. | |
| 6,542,682 B1 | 4/2003 | Cotteverte et al. | |
| 6,559,491 B1 | 5/2003 | Forbes et al. | |
| 6,566,682 B1 | 5/2003 | Forbes | |
| 6,579,738 B1 | 6/2003 | Farrar et al. | |
| 6,582,512 B1 | 6/2003 | Geusic et al. | |
| 6,583,437 B1 | 6/2003 | Mizuno et al. | |
| 6,589,334 B1 | 7/2003 | John et al. | |
| 6,593,625 B1 | 7/2003 | Christiansen et al. | |
| 6,597,203 B1 | 7/2003 | Forbes | |

| | | |
|---|---|---|
| 6,630,713 B1 | 10/2003 | Geusic |
| 6,630,724 B1 | 10/2003 | Marr |
| 6,649,476 B1 | 11/2003 | Forbes |
| 6,656,822 B1 | 12/2003 | Doyle et al. |
| 6,657,277 B1 | 12/2003 | Hsieh |
| 6,674,667 B1 | 1/2004 | Forbes |
| 6,740,913 B1 | 5/2004 | Doyle et al. |
| 6,898,362 B1 | 5/2005 | Forbes et al. |
| 6,929,984 B1 | 8/2005 | Forbes et al. |
| 6,943,065 B1 | 9/2005 | Bhattacharyya et al. |
| 2003/0042534 A1 | 8/2001 | Bhattacharyya |
| 2002/0001965 A1 | 1/2002 | Forbes |
| 2002/0048968 A1 | 4/2002 | Ahn |
| 2002/0062782 A1 | 5/2002 | Norris et al. |
| 2002/0070419 A1 | 6/2002 | Farrar et al. |
| 2002/0070421 A1 | 6/2002 | Ashburn |
| 2002/0076896 A1 | 6/2002 | Farrar et al. |
| 2002/0079557 A1 | 6/2002 | Ahn et al. |
| 2002/0175330 A1 | 11/2002 | Geusic et al. |
| 2002/0182837 A1 | 12/2002 | Daubenspeck et al. |
| 2002/0185686 A1 | 12/2002 | Christiansen et al. |
| 2003/0027406 A1 | 2/2003 | Malone |
| 2003/0042627 A1 | 3/2003 | Farrar et al. |
| 2003/0075438 A1 | 4/2003 | Dalmia et al. |
| 2003/0071324 A1 | 5/2003 | Motsiff et al. |
| 2003/0131782 A1 | 7/2003 | Geusic et al. |
| 2003/0133683 A1 | 7/2003 | Forbes et al. |
| 2003/0157780 A1 | 8/2003 | Farrar et al. |
| 2003/0181018 A1 | 9/2003 | Geusic et al. |
| 2003/0190796 A1 | 10/2003 | Geusic |
| 2003/0201468 A1 | 10/2003 | Christiansen et al. |
| 2003/0218189 A1 | 11/2003 | Christiansen et al. |
| 2003/0227072 A1 | 12/2003 | Forbes |
| 2004/0171196 A1 | 9/2004 | Walitzki |
| 2004/0176483 A1 | 9/2004 | Geusic |
| 2004/0266220 A1 | 12/2004 | Ahn et al. |
| 2005/0017273 A1 | 1/2005 | Forbes et al. |
| 2005/0020094 A1 | 1/2005 | Forbes et al. |
| 2005/0023638 A1 | 2/2005 | Bhattacharyya et al. |
| 2005/0029501 A1 | 2/2005 | Geusic et al. |
| 2005/0029683 A1 | 2/2005 | Forbes et al. |
| 2005/0089292 A1 | 4/2005 | Kinoshita |
| 2005/0010869 A1 | 5/2005 | Forbes et al. |
| 2005/0070036 A1 | 5/2005 | Geusic et al. |
| 2005/0250274 A1 | 11/2005 | Forbes et al. |

FOREIGN PATENT DOCUMENTS

| | | |
|---|---|---|
| EP | 1030196 | 8/2000 |
| EP | 1085352 | 3/2001 |
| JP | 2001-093887 | 4/2001 |
| WO | WO 98/35248 | 8/1998 |
| WO | WO 02/097982 | 12/2002 |

OTHER PUBLICATIONS

Tsutomu Sato, et al.—"A New Substrate Engineering for the Formation of Empty Space in Silicon (ESS) Induced by Silicon Surface Migration," 1999 IEEE, pp. 517-520*.

U.S. Appl. No. 09/069,346, filed Apr. 29, 1998, pp. 1-22 w/6 shts. drwgs.*.

Abe, T.; Nakano, M.; Itho, T.; Takei, T.; Uchiyama, A.; Yoshizawa, K.; Nakazato, Y., Silicon Wafer-Bonding Process Technology for SOI Structures, Extended Abstracts of the 22nd Int'l Conference on Solid State Devices and Materials, Sendai, (1990) 853-856.

Abelmann, Leon; Lodder, C., Oblique evaporation and surface diffusion, Think Solid Films 305 (1997) 1-21.

Asoh, Heditaka; Nishio, K.; Nakao, M.; Yokoo, A.; Tamaura, T.; Masuda, H., Fabrication of ideally ordered anodic porous alumina with 63 nm hole periodicity using sulfuric acid, J. Vac. Sci. Technol. B 19(2) Mar./Apr. (2001) 569-572.

Auberton-Herve, A.J., SOI: Materials to Systems, Int'l Electron Devices Meeting, Technical Digest (1996) 3-10.

Autumn, Kellar; Liang, Y.A.; Hsieh, S.T.; Zesch, W.; Chan, W.P.; Kenny, T.W.; Fearing, R.; Full, R.J., Adhesive force of a single gecko foot-hair, Nature, 405, Jun. 8, 2000, 681-685.

Autumn, Kellar; Sitti, M.; Liang, Y.A.; Peattie, A.M.; Hansen, W.R.; Sponberg, S.; Kenny, T.W.; Fearing, R.; Israelachvili, J.N.; Full, R.J., Evidence for van der Waals adhesion in gecko setae, Proc. of the National Academy of Science, 99(19) Sep. 17, 2002, 12252-12256.

Baginski, Thomas A., Back-side Germanium Ion Implantation Gettering of Silicon, J. Electrochem. Soc.: Solid-State Science and Technology, 135(7) Jul. 1988, 1842-1843.

Banhart, John, Manufacture, characterization and application of cellular metals and metal foams, Progress in Materials Science 46 (2001) 559-632.

Banhart, John; Weaire, D., On the Road Again: Metal Foams Find Favor, Physics Today, Jul. 2002, 37-42.

Beauvais, Jacques: Lavallee, E.; Drouin, D.; Turcotte, D., Nano-Imprint Lithography Using Materials Fabricated by SIDWELL Process, J. Vac. Sci. Technol. B, 17, 2957 (1999).

Belford, Rona E.; Zhao, W.; Potashnik, J.; Liu, Q.; Seabaugh, A., Performance-Augmented CMOS Using Back-End Uniaxial Strain, IEEE 60th DRC., Conference Digest, 2002, 41-42.

Bertl, M.; Mazzi, G.; Calagnile, L.; Drigo, A.V.; Merli, P.G.; Migliori, A., Composition and structure of Si-Ge layers produced by ion implantation and laser melting, J. Mater. Res., 6(10) Oct. 1991, 2120-2126.

Bertl, M.; Mazzi, G.; Drigo, A.V.; Migliori, A.; Jannitti, E.; Nicoletti, S., Laser induced epitaxial regrowth of $Si_{1-x}Ge_x/Si$ layers produced by Ge ion implantation, Applied Surface Science 43 (1989) 158-164.

Bhattacharyya, A.; Bass, R.; Tice, W.; Baxter, R.; Derenthal, T., Physical and Electrical Characteristics of LPCVD Si-Rich Nitride, J. Electrochem. Soc., 131(11)469C.

Bialas, F.; Winkler, R.; Dietrich, H., Intrinsic gettering of 300 mm CZ wafers, Microelectronic Engineering 56 (2001) 157-163.

Binns, M.J.; Banerjee, A.; Wise, R.; Myers, D.J.; McKenna, T.A., The Realization of Uniform and Reliable Intrinsic Gettering in 200mm p- and p/p- Wafers for a Low Thermal Budget 0.18μm Advanced CMOS Logic Process, Solid State Phenomena, vols. 82-84 (2002) 387-392.

Birner, A.; Gruning, U.; Ottow, S.; Schneider, A.; Muller, F., Lehmann, J.; Foll, H.; Gosele, U.; Macroporous Silicon: A two-Dimensional Photonic Bandgap Material Suitable for the Near-Infrared Spectral Range, Phys. Stat. Sol. (a) 165 (1998) 111-117.

Birner, Albert; Wehrspohn, R.B.; Gosele, U.M.; Busch, K., Silicon-Based Photonic Crystals, Adv. Mater. 13(6) Mar. 16, 2001, 377-388.

Blanco, Alvaro, et al., Large-scale synthesis of a silicon photonic crystal with a complete three-dimensional bandgap near 1.5 micrometres, Nature, 405, May 25, 2000, 437-440.

Blanford, Christopher; Yan, H.; Schroden, R.C.; Al-Daous, M.; Stein, A., Gems of Chemistry and Physics: Macroporous Metal Oxides with 3D Order, Adv. Mater. 13(6) Mar. 16, 2001, 401-407.

Bronner, Gary; Plummer, J.D.; Physical Modeling of Backside Gettering, Mat. Res. Soc. Symposia Proceedings vol. 36, Boston, Nov. 27-30, 1984, 49-54.

Brown, Chappell, Bonding twist hints at universal substrate, EETimes (1997) 2 pgs.

Bruel, Michel; Aspar, B.; Auberton-Herve, A.-J., Smart-Cut: A New Silicon On Insulator Material Technology Based on Hydrogen Implantatation and Wafer Bonding, Jpn. J. Appl. Phys., vol. 36 (Mar. 1997) Pt. 1, No. 3B, 1636-1641.

CRC Handbook of Chemistry and Physics, 49th ed. (c1968) The Chemical Rubber Pub. Co., Cleveland, OH, E-61.

Chen, Xiangdong; Ouyang, Q.; Liu, K.-C; Shi, Z.; Tasch, A.; Banerjee, S., Vertical P-MOSFETS with heterojunction between source/drain and channel, 58th Device Research Conference Digest, Jun. 19-21, 2000, Denver, CO, 5-26.

Chilton, B.T.; Robinson, B.J.; Thompson, D.A.; Jackman, T.E.; Baribeau, J.-M., Solid phase epitaxial regrowth of $Si_{1-x}Ge_x/Si$ strained-layer structures amorphized by ion implantation, Appl. Phys. Lett. 54(1) Jan. 2, 1989, 42-44.

Choe, K.S.; JanG, B.N., Minority-carrier lifetime optimization in silicon MOS devices by intrinsic gettering, J. of Cryst. Growth 218 (2000) 239-244.

Chou, Stephen Y.; Krauss, P.R., Imprint Lithography with Sub- 10 nm Feature Size and High Throughput Microelectronic Engineering 35 (1997) 237-240.

Chou, Stephen Y.; Krauss, P.R.; Zhang, W.; Guo, L.; Zhuang, L., Sub-10 nm imprint lithography and applications, J. Vac. Sci. Technol. B 15(6) Nov./Dec. 1997, 2897-2904.

Clark, Don, Intel Unveils New Technology for Creating Tiny Transistors, The Wall Street Journal, Aug. 13, 2002, P.1.

Clifton, P.A.; Routley, P.R.; Gurry, P.K.; O'Neill, A.G.; Carter, J.A.; Kemhadjian, H.A., A Process for Strained Silicon n-Channel HMOSFETS, Proc. of the 26th European Solid State Device Research Conference, Sep. 9-11, 1996, Bologna, Italy, 519-522.

Colgan, M.J.; Brett, M.J., Field emission from carbon and silicon films with pillar microstructure, Thin Solid Films 389 (2001) 1-4.

Cornell Demonstrates a Universal Substrate, Compound Semiconductor, Mar./Apr. 1997, 3(2) 27.

Das, B.; McGinnis, S.; Miller, A., Template Based Semiconductor Nanostructure Fabrication and their Applications, Invited Paper, 11th International Workshop in the Physics of Semiconductor Devices (2001) D.1.1.

Devasahayam, Adrian J.; Agatic, I.; Zaritsky, I.; Druz, B.; Hegde, H.; Das, S.R.; LaFramboise, S., Material Properties of Ion Beam Deposited Oxides for the Opto-Electronic Industry, 10th Canadian Semiconductor Technology Conference, Ottawa, Aug. 13-17, 2001, Th1.3,185.

Dubbleday, Wadad B.; Kavanagh, K.L., Oscillatory Strain Relaxation in Solid Phase Epitaxially Regrown Silicon on Sapphire, Lattice Mismatched Thin Films, E.A. Fitzgerald, Ed., The Minerals, Metals & Materials Society Pub., c1999, 13-17.

Edrington, Alexander C., et al., Polymer-Based Photonic Crystals, Adv. Mater., 13(6) Mar. 16, 2001, 421-425.

Fischetti, M.V.; Laux, S.E., Band structure, deformation potentials, and carrier mobility in strained Si, Ge, and SiGe alloys, J. Appl. Phys. 80(4) Aug. 15, 1996, 2234-2252.

Fournel, F.; Moriceau, H.; Aspar, B.; Magnea, N.; Eymery, J.; Rousseau, K.; Rouviere, J.L., Ultra High Precision of the Tilt/Twist Misorientation Angles in Silicon/Silicon Direct Wafer Bonding, Electronic Materials Conference Abstract, Jun. 2002, 9.

Garcia, G.A.; Reedy, R.E.; Burgener, M.L., High-Quality CMOS in Thin (100 nm) Silicon on Sapphire, IEEE Electron Device Letters, 9(1) Jan. 1988, 32-34.

Godbole, H.; Haddad, H.; Forbes, L., An investigation of bulk stacking faults in silicon using photocapacitance transient spectroscopy, Materials Letters, 8 (6, 7) Jul. 1989, 201-203.

Gong, S.S.; Schroder, D.K., Implantation gettering in silicon, Solid-State Electronics, 30(2) (1987) 209-211.

Graf, D.; Lambert, U.; Schmolke, R.; Wahlich, R.; Siebert, W.; Daub, E.; Ammon, W.V., 300 mm EIP PP-wafer: Is there sufficient gettering?, Electrochemical Soc. Proc. vol.; 2000-17, 319-330.

Haddad, H.; Forbes, L.; Burke, P.; Richling, W.; Carbon Doping Effects on Hot Electron Trapping, IEEE Electron Devices Soc. 28th Ann. Proc. Mar. 27-29, 1990, New Orleans, LA, 288-289.

Haddad, H.; Forbes, L., Electrical activity of bulk stacking faults in silicon, Materials Letters, 7(3) Sep. 1988, 99-101.

Harendt, C.; Hunt, C.; Appel, W.; Graf, H.-G., Hofflinger, B.; Penteker, E., Silicon on Insulator Material by Wafer Bonding, J. Electronic Materials, 20(3) Mar. 1991, 267-277.

Ho, K.M.; Chan, C.T.; Soukoulis, C.M., Existence of a Photonic Gap in Periodic Dielectric Structures, Phys. Rev. Lett. 65(25) Dec. 17, 1990, 3152-3155.

Holland, Brian T.; Blanford, C.F.; Stein, A., Synthesis of Macroporous Minerals with Highly Ordered Three-Dinemsional Arrays of Spheroidal Voids, Science, 281 Jul. 24, 1998, 538-540.

Iyer, S. Sundar Kumar, et al., Separation by Plasma Implantation of Oxygen (SPIMOX) Operational Phase Space, IEEE Transactions on Plasma Science, 25(5) Oct. 1997, 1128-1135.

Jeng, Shin-Puu; Chang, M.-C.; Kroger, T.; McAnally, P.; Havemann, R.H., A Planarized Multilevel Interconnect Scheme With Embedded Low-Dielectric-Constant Polymers For Sub-Quarter-Micron Applications, 1994 Symposium on VLSI Technology Digest of Technical Papers 73-74.

Jiang, Peng; Ostojic, G.N.; Narat, R.; Mittleman, D.M.; Colvin, V.L., The Fabrication and Bandgap Engineering of Photonic Multilayers, Adv. Mater. 13(6) Mar. 16, 2001, 389-393.

Jin, C.; Lin, S.; Wetzel, J.T., Evaluation of Ultra-Low-k Dielectric Materials for Advanced Interconnects, J. Electronic Materials, 30(4) 2001, 284-289.

Joannapoulos, John D.; Meade, R.D., Winn, J.N., Photonic Crystals, Molding the Flow of Light, c1995, Princeton University Press, Princeton, NJ, 6.

John, Sageeve; Busch, K., Photonic Bandgap Formation and Tunability in Certain Self-Organizing Systems, J. Lightwave Technology, 17(11) Nov. 1999, 1931-1943.

Johnson, Steven G.; Fan, S.; Villeneuve, P.R.; Joannopoulos, J.D.; Kolodziejski, L.A., Guided modes in photonic crystal slabs, Phys. Rev. B, 60(8), Aug. 15, 1999, 5751-5758.

Jurczak, M., et al., SON (Silicon On Nothing)—A New Device Architecture for the ULSI Era, 1999 Symposium on VLSI Technology Digest of Papers, 29-30.

Kalavade, Pranav; Saraswat, K.C., A Novel sub-10nm Transistor, 58th DRC, Conf. Dig. Jun. 19-21, 2000, 71-72.

Kang, J.S.; Schroder, D.K., Gettering in silicon, J. Appl. Phys., 65(8) Apr. 15, 1989, 2974-2985.

Karunasiri, R.P.U.; Bruinsma, R.; Rudnik, J., Thin-Film Growth and the Shadow Instability, Phys. Rev. Lett., 62(7) Feb. 13, 1989, 788-791.

Kingery, W.D., Introduction to Ceramics, (c1963), John Wiley & Sons, Inc., New York, 262-263.

Kittel, Charles, Introduction to Solid State Physics, 3rd ed., (c1966) John Wiley & Sons, Inc., New York, 25.

Kostrzewa, M., et al., Testing the Feasibility of Strain Relaxed Compliant Substrates, EMC 2003 Int'l Conf. Indium Phosphide and Related Materials, Jun. 8.

Kung, C.Y.; Forbes, L.; Peng, J.D., The effect of carbon on oxygen precipitation in high carbon CZ silicon crystals, Mat. Res. Bull., vol. 18, 1983, 1437-1441.

Lasky, J.B., Wafer bonding for silicon-on-insulator technologies, Appl. Phys. Lett., 48(1) Jan. 6, 1986, 78-80.

Li, Zhi-Yuan; Zhang, Z.-Q., Photonic Bandgaps in Disordered inverse-Opal Photonic Crystals, Adv. Mater. 13(6) Mar. 16, 2001, 433-436.

Li, Y.X.; Liu, C.C.; Guo, H.Y.; Wang, X.; Pan, M.X.; Xu, Y.S.; Yang, D.R.; Que, D.L., New Intrinsic Gettering Process in Czochralski-silicon Wafer, 2001 6th Int'l Conf. on Solid-State and Integrated-Circuit Technology Proc., vol. 1, Oct. 22-25, Shanghai, CN, 277-279.

Lin, Shawn-Yu; Fleming, J.G., A Three-Dimensional Optical Photonic Crystal, J. Lightwave Technol., 17(11) Nov. 1999, 1944-1947.

Loncar, Marko; Nedeljkovic, D.; Doll, T.; Vuckovic, J.; Scherer, A.; Pearsall, T.P., Waveguiding in planar crystals, Appl. Phys. Lett., 77(13) Sep. 25, 2000, 1937-1939.

Loo, Y.-L; WIllett, R.L.; Baldwin, K.W.; Rogers, J.A., Contact printing with nanometer resolution, 60th DRC, Jun. 24-26, 2002, Santa Barbara, CA, 149-150.

Lu, Deren; Wortman, J.J.; Fathy, D., Bonding silicon wafers by use of electrostatic fields followed by rapid thermal heating, Materials Letters, 4(11,12) Oct. 1986, 461-464.

Lu, Yu, Yin, Y.; Xia, Y., Three-Dimensional Photonic Crystals with Non-spherical Colloids as Building Blocks, Adv. Mater., 13(6) Mar. 16, 2001, 415-420.

Malac, Marek; Bret, M., Thin Films Deposited at Glancing Incidence and their Applications, Vacuum Technology & Coating, Jul. 2001, 48-53.

Manoharan, Vinothan N.; Imhof, A.; Thorne, J.D.; Pine, D.J., Photonic Crystals from Emulsion Templates, Adv. Mater., 13(6) Mar. 16, 2001, 447-450.

Messier, R.; Gehrke, T.; Frankel, C.; Venugopal, V.C.; Otano, W.; Lakhtakia, A.; Engineered sculptured nematic thin films, J. Vac. Sci. Technol. A 15(4) Jul./Aug. 1997, 2148 2152.

Miguez, Heman; Meseguer, F.; Lopez, C.; Lopez-Tejeira, F.; Sanches-Dehesa, J., Synthesis and Photonic Bandgap Characterization of Polymer Inverse Opals, Adv. Mater., 13(6) Mar. 16, 2001, 393-396.

Mitsutake, Kunihiro; Ushiku, Y., Theoretical Study on the Formation Process of Empty Space in Silicon (ESS), 2000 Int'l Conf. on Solid-State and Integrated Circuit Technol., 198-199.

Mizuno, T.; Sugiyama, N.; Satake, H.; Takagi, S., Advanced SOI-MOSFETS with Strained-Si Channel for High Speed CMOS-Electron/Hole Mobility Enhancement, 2000 Symposium on VLSI Technol., Digest of Technical Papers, 210-211.

Mizushima, I.; Sato, T.; Taniguchi, S.; Tsunashima, Y., Empty-space-in-silicon technique for fabricating a silicon-on-nothing structure, Appl. Phys. Lett. 77(20) Nov. 13, 2000, 3290-3292.

Morey, George W., The Properties of Glass, 2nd ed., c1954, Reinhold Pub. Corp., New York, 12, 48-49.

Mumola., P.B.; Gardopee, G.J.; Mathur, D.P.; Siniaguine, O., Recent advances in thinning of bonded SOI wafers by plasma assisted chemical etching, Proc. of the 3rd Int'l Symposium on Semiconductor Wafer Bonding: Physics and Applications, The Electrochemical Soc., 1995, vols. 95-7, 28-32.

Nayak, D.K.; Park, J.S.; Woo, J.C.S.; Wang, K.L.; Yabiku, G.K.; MacWilliams, K.P., High Performance GeSi Quantum-Well PMOS on SIMOX, Int'l Electron Devices Meeting, 1992, 777-780.

New Scientist.com, Secret of 'strained silicon' chips revealed, Dec. 17, 2003, http://www.newscientist.com/news/print.isp?id=ns999944923 2 pages.

Nl, Peigen; Dong, P.; Cheng, B.; Li, X.; Zhang, D., Synthetic $SiO_2$ Opals, Adv. Mater., 13(6) Mar. 16, 2001, 437-441.

Norris, David J.; Vlasov, Y.A., Chemical Approaches to Three-Dimensional Semiconductor Photonic Crystals, Adv. Mater., 13(6) Mar. 16, 2001, 371-376.

Omi, Hiroo; Bottomley, D.; Ogino, T., Semiconductor Surface with Strain Control, http://www.bri.net.co.jp/J/kouhou/katsudou/report00/E/report04_e.html one page.

O'Neill, A.G.; Antoniadis, D.A., High speed deep sub-micron MOSFET using high mobility strained silicon channel, Proc. of the 25th European Solid State Device Res. Conf. Sep. 25-27, 1995, The Hague, NL, 110-112.

Or, B.S.S.; Forbes, L.; Haddad, H.; Richling, W., Annealing Effects of Carbon in n-Channel LDD MOSFETS's, IEEE Electron Device Letters, 12(11) Nov. 1991, 596-598.

Ouyang, Q.; Chen, X.D.; Mudanai, S.; Kencke, D.L.; Tasch, A.F.; Banerjee, S.K., Bandgap Engineering in Deep Submicron Vertical pMOSFETSs, 58th DRC, Conf. Digest, Jun. 19-21, 2000, 27-28.

Paine, D.C.; Howard, D.J.; Stoffel, N.G.; Horton, J.A., The growth of strained $Si_{1-x}Ge_x$ alloys on (001) silicon using solid phase epitaxy, J. Mater. Res., 5(5) May 1990, 1023-1031.

Pandya, D.K.; Rastogi, A.C.; Chopra, K.L., Obliquely deposited amorphous Ge films. I. Growth and structure, J. Appl. Phys., 46(7) Jul. 1975, 2966-2975.

People, R.; Bean, J.C., Calculation of critical layer thickness versus lattice mismatch for $Ge_xSi_{1-x}$/Si strained-layer heterostructures, Appl. Phys. Lett. 47(3) Aug 1, 1995, 322-324 (Erratum attached).

Rim, Kern; Hoyt, J.L.; Gibbons, J.F., Fabrication and Analysis of Deep Submicron Strained-Si N-MOSFET's, IEEE Transactions on Electron Devices, 47(7) Jul. 2000, 1406-1415.

Rim, K, et al., Strained Si NMOSFETs for High Performance CMOS Technology, 2001 Symposium on VLSI Technol., Digest of Technical Papers, 59-60.

Rim, Kern; Hoyt, J.L.; Gibbons, J.F., Transconductance Enhancement in Deep Submicron Strained-Si n-MOSFETs, Int'l Electron Devices Meeting 1998, Technical Digest, 707-710.

Robbie, K.; Brett, M.J., Sculptured thin films and glancing angle deposition: Growth mechanics and applications, J. Vac. Sci. Technol. A 15(3) May/Jun. 1997, 1460-1465.

Rubin, Leonard; Pech, R.; Huber, D.; Brunner, J.; Morris, W., Effective Gettering of Oxygen by High Dose, High Energy Boron Buried Layers, 1998 Int'l Conf. on Ion Implantation Technol. Proc. Kyoto, JP, Jun. 22-26, 1010-1013.

Sato, Tsutomu, et al., Trench Transformation Technology using Hydrogen Annealing for Realizing Highly Reliable Device Structure with Thin Dielectric Films, 1998 Symp. on VLSI Technolo. Digest of Technical Paper, 206-207.

Smith, C.J.M., et al., Low-loss channel waveguides with two-dimensional photonic crystal boundaries, Appl. Phys. Lett., 77(18) Oct. 30, 2000, 2813-2815.

Subramania, Ganapathi; Constant, K.; Biswas, R.; Sigalas. M.M.; Ho, K.-M, Inverse Face-Centered Cubic Thin Film Photonic Crystals, Adv. Mater. 13(6) Mar. 16, 2001, 443-446.

Sugiyama, N.; Mizuno, T.; Takagi, S.; Koike, M.; Kurobe, A., Formation of strained-silicon layer on thin relaxed-$SiGe/SiO_2$/Si structure using SIMOX technology, Thin Solid Films, 369 (2000) 199-202.

Tait, R.N.; Smy, T.; Brett, M.J., Modelling and characterizations of columnar growth in evaporated films, Thin Solid Films, 236 (1993) 196-201.

Takagi, Shin-ichi, Strained-Si- and SiGe-On-Insulator (Strained-SOI and SGOI) MOSFETs for High Performance/Low Power CMOS Application, IEEE 60th DRC, Conf. Digest (2002) 37-40.

Tan, T.Y.; Gardner, E.E.; Tice, W.K., Intrinsic gettering by oxide precipitate induced dislocations in Czochralski Si, Appl. Phys. Lett., 30(4) Feb. 15, 1977, 175-176.

Tessier, P.M.; Velev, O.D.; Kalambur, A.T.; Lenhoff, A.M.; Rabolt, J.F.; Kaler, E.W., Structured Metallic Films for Optical and Spectroscopic Applications via Colloidal Crystal Templating, Adv. Mater. 13(6) Mar. 16, 2001, 396-400.

Thornton, John A., High Rate Thick Film Growth, Ann. Rev. Mater. Sci., 7(1977) 239-260.

Treichel, H., Low Dielectric Constant Materials, J. Electronic Mater., 30(4) 2001, 290-298.

Verdonckt-Vandebroek, Sophie, et al., SiGe-Channel Heterojunction p-MOSFET's, IEEE Transactions on Electron Devices, 41(1) Jan. 1994, 90-101.

Welser, J.; Hoyt, J.L.; Takagi, S.; Gibbons, J.F., Strain Dependence of the Performance Enhancement in Strained-Si η-MOSFETs, IEEE Int'l Electron Devices Meeting, Technical Digest, Dec. 11-14, 1994, 373-376.

Whitwer, F.D.; Haddad, H.; Forbes, L., DLTS Characterization of Precipitation Induced Microdefects, Mat. Res. Soc. Symp. Proc. 71, Apr. 1986, 53-57.

Wijaranakula, W.; Burke, P.M.; Forbes, L.; Matlock, J.H., Effect of pre- and postepitaxial deposition annealing on oxygen precipitation in silicon, J. Mater. Res. 1(5) Sep./Oct. 1986, 698-704.

Wijaranakula, W.; Burke, P.; Forbes, L.; Matlock, J.H., Effect of Preanneal Heat Treatment on Precipitation in Epitaxial Silicon, Mat. Res. Soc. Symp. Proc., 71, Apr. 1986, 139-144.

Wijaranakula, W.; Burke, P.M.; Forbes. L., Internal gettering heat treatments and oxygen precipitation in epitaxial silicon wafers, J. Mater. Res., 1(5) Sep./Oct. 1986, 693-697.

Wijaranakula, W.; Matlock, J.H.; Mollenkopf, H.; Burke, P.; Forbes, L., Oxygen Precipitation in P/P+(100) Epitaxial Silicon Material, J. Electrochemical Soc., 134(9) Sep. 1987, 2310-2316.

Wild, M., Laser Asissted Bonding of Silicon and Glass in Micro-System Technology, (2003) http://www.ilt.fraunhofer.de/ilt/php/default.php?id=100265&lan=eng&dat=2 one page.

Wolcik, J.; Simionescu, C.G.; Lennard, W.N.; Haugen, H.K.; Davies, J.A.; Mascher, P., Characterization of Silicon Oxynitride Thin Films Deposited by ECR-PECVD, 10th Canadian Semiconductor Technology Conf., Aug. 13-17, 2001, 184.

Xia, Younan, Photonic Crystals, Adv. Mater., 13(6) Mar. 16, 2001, 369.

Xia, Younan; Gates B.; Li, Z.-Y., Self-Assembly Approaches to Three-Dimensional Photonic Crystals, Adv. Mater. 13(6) Mar. 16, 2001, 409-413.

Xuan, Peiqi; Kedzierski, J.; Subranmanian, V.; Bokor, J.; King, T.-J., Hu, C., 60nm Planarized Ultra-thin Body Solid Phase Epitaxy MOSFETs, IEEE 58th DRC Meeting. Conf. Digest, Jun. 19-21, 2001, 67-68.

Yablonovitch, Eli, Inhibited Spontaneous Emission in Solid-State Physics and Electronics, Physical Rev. Lett., 58(20) May 18, 1987, 2059-2062.

Yablonovitch, Eli; Gmitter, T.J.; Leung, K.M., Photonic Band Structure: The Face-Centered-Cubic Case Employing Nonspherical Atoms, Physical Rev. Lett. 67(17) Oct. 21, 1991, 2295-2298.

Yang, Deren; Fan, R.; Shen, Y.; Tian, D.; Li, L.; Que, D., Intrinsic gettering in nitrogen doped Czochralski crystal silicon, Proc. of the 6th Int'l Symp. High Purity Silicon VI, The Electrochemical Soc., Inc., 17 (2000) 357-361.

Yang, Deren; Que, D., Nitrogen in Czochralski Silicon, 6th Int'l Conf. on Solid-State and Integrated Circuit Technol., 1(1) 2001, 255-260.

Yang, Peidong; Rizvi, A.H.; Messer, B.; Chmelka, B.F.; Whitesides, G.M.; Stucky, G.D., Patterning Porous Oxides within Microchannel Networks, Adv. Mater., 13(6) Mar. 16, 2001, 427-431.

Yin, Haizhou, et al., High Ge-Content Relaxed $Si_{1-x}Ge_x$ Layers by Relaxation on Compliant Substrate with Controlled Oxidation, Electronic Materials Conf., Santa Barbara, CA, Jun. 2002, 8.

Zhang, F., et al., Nanoglass™ E Copper Damascene Processing for Etch, Clean and CMP, IEEE Int'l Interconnect Technol. Conf., (2001) 57-59.

Zhu, Z.H., Ejeckam, F.E.; Zhang, Z.; Zhang, J.; Qian, Y.; Lo,Y.-H, 10th Ann. Meeting IEEE Lasers and Electro-Optics Soc., Conf. Proc., Nov. 10-13, 1996. 31.

Zhu, Z.-H., et al. Wafer Bonding Technology and its Applications in Optoelectronic Devices and Materials, IEEE J. Selected Topics in Quantum Electronics, 3(3) Jun. 1997, 927-936.

* cited by examiner

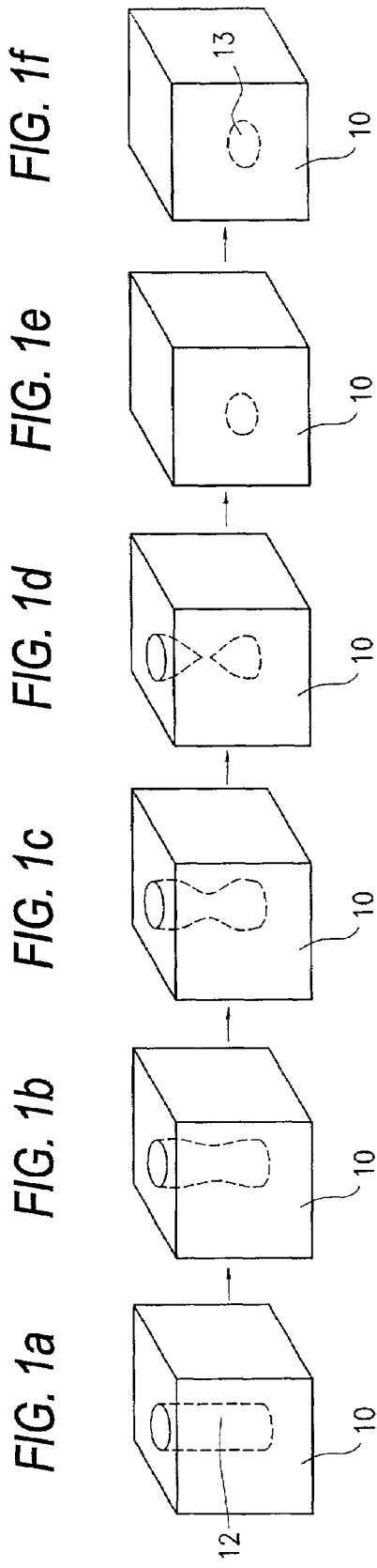

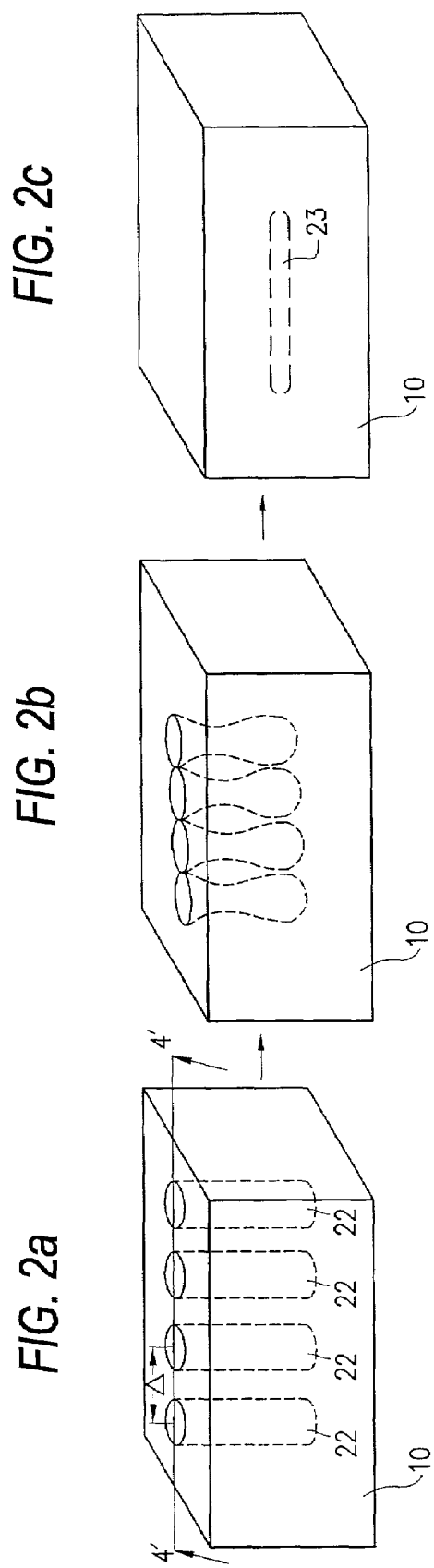

US 7,164,188 B2

BURIED CONDUCTOR PATTERNS FORMED BY SURFACE TRANSFORMATION OF EMPTY SPACES IN SOLID STATE MATERIALS

This application is a divisional of application Ser. No. 09/734,547, filed on Dec. 13, 2000 now U.S. Pat. No. 6,383,924, which is hereby incorporated by reference.

FIELD OF THE INVENTION

The present invention relates to semiconductor devices and methods of making such devices. More particularly, the invention relates to solid state materials and to a novel method of forming buried conductor patterns in such solid state materials.

BACKGROUND OF THE INVENTION

Monocrystalline solid state materials such as single-crystal semiconductors are the basis of the current microelectronics industry. Solid state materials are characterized by a variety of properties, for example, electrical properties such as electrical conductivity or charge mobility, optical properties such as refractive index or speed of photons, thermal properties such as thermal conductivity or thermal expansion, mechanical properties such as stress or strain curves, and chemical properties such as resistance to corrosion or reaction consistency, among others.

Over the past years, the semiconductor industry has constantly explored new ways of increasing the amount of active surface area on the integrated circuit chips, particularly on those employing monocrystalline semiconductor substrates.

Accordingly, attempts to modify the electrical, optical, thermal and/or mechanical properties of such monocrystalline substrates have been made in an effort to minimize the dimensions of the IC devices, while maximizing the corresponding available active area. For example, new epitaxial growth processes such as the Epitaxial Lateral Overgrowth (ELO) have been used in an attempt to extend the amount of surface area available to active devices. However, these growth processes had limited results mainly because they consume part of the precious surface areas for seeding purposes, defeating therefore the primary purpose of increasing the available active area.

Another technology proposed by the semiconductor industry is the so-called Silicon-On-Insulator (SOI) process, wherein oxygen atoms are implanted at high dose and energy to form a silicon dioxide insulating layer between the upper surface of the original monocrystalline substrate and the bottom bulk portion of the same substrate. Although the SOI devices have many advantages, such as reduced parasitic capacitance due to the buried insulating layer, the process is relatively expensive because of the high costs of implanting the oxygen atoms and curing of the implant-induced defects.

Accordingly, there is a need for an improved method of increasing the available active surface area on integrated circuit chips fabricated on monocrystalline substrates. There is also a need for a more advantageous method of forming monocrystalline superconducting substrates for low power and high speed microelectronics devices, as well as a method for minimizing the cost of fabricating such substrates. There is further a need for an improved metallization scheme which facilitates the formation of active devices on SOI substrates and on the more novel Silicon-On-Nothing (SON) substrates.

SUMMARY OF THE INVENTION

The present invention provides a method of forming a plurality of buried conductors and/or buried plate patterns in semiconductor substrates, such as monocrystalline silicon substrates. According to an exemplary embodiment of the invention, a plurality of empty-spaced buried patterns are formed in a monocrystalline substrate. Holes are next formed in the monocrystalline substrate to connect surfaces of the substrate with the previously formed empty-spaced patterns. The whole assembly is subsequently exposed to an oxidizing atmosphere so that the inner surfaces of the empty-spaced patterns are oxidized. The empty-spaced patterns are then filled with a suitable conducting material by suitable methods.

These and other features and advantages of the invention will be more clearly apparent from the following detailed description which is provided in connection with accompanying drawings and which illustrates exemplary embodiments of the invention.

BRIEF DESCRIPTION OF THE DRAWINGS

FIGS. 1(a)–(f) illustrate a portion of a silicon substrate undertaking a sequence of steps for single sphere-shaped empty space formation.

FIGS. 2(a)–(c) illustrate a portion of a silicon substrate undertaking a sequence of steps for single pipe-shaped empty space formation, performed in accordance with a method of forming a buried pattern of the present invention.

FIG. 14A is a cross-sectional view of a representative silicon structure according to a third embodiment of the present invention and at a stage of processing subsequent to that shown in FIG. 4.

DETAILED DESCRIPTION OF THE EMBODIMENTS

Figure 3B:
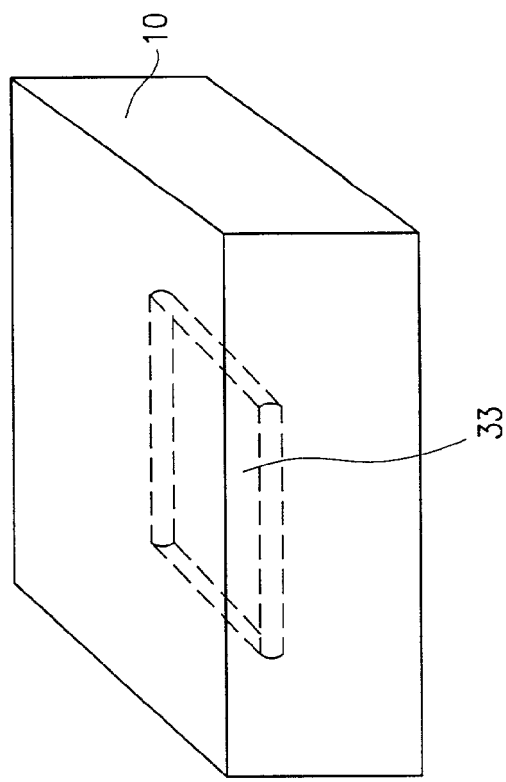
FIGS. 3(a)–(b) illustrate a portion of a silicon substrate undertaking a sequence of steps for plate-shaped empty space formation, performed in accordance with a method of forming a buried pattern of the present invention.

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is defined by the appended claims.

The term "substrate" used in the following description includes any semiconductor-based structure having an exposed surface in which the structure of this invention may be formed. The term "substrate" is to be understood as including substrates formed of silicon, silicon-on-insulator, doped and undoped semiconductors, epitaxial layers of silicon supported by a base semiconductor foundation, and other semiconductor and dielectric structures. Furthermore, when reference is made to a substrate in the following description, previous process steps may have been utilized to form regions or junctions in the base semiconductor structure or foundation.

The following illustration is for a particular embodiment in a silicon structure. However, it should be apparent to one skilled in the art that a similar embodiment is possible in any semiconductor structure.

Referring now to the drawings, where like elements are designated by like reference numerals, FIGS. 4–14 illustrate exemplary embodiments of a buried silicon structure 100 comprising buried conductor patterns formed in accordance with the present invention. FIGS. 1–3 illustrate the formation of empty-spaced patterns in a silicon substrate 10, on which the buried conductor patterns of the present invention will be formed. Techniques for the formation of empty-spaced patterns of different geometries are described by Sato et al., in *Substrate Engineering for the Formation of Empty Space in Silicon* (ESS) *Induced by Silicon Surface Migration,* 1999 IEDM Digest, Paper 20.6.1, the disclosure of which is incorporated by reference herein.

Empty spaces which are formed in silicon substrates and have various shapes, such as plates, spheres or pipes, may be formed as a result of the self-organizing migration properties on the silicon surface. As such, when deeply-etched silicon substrates are annealed in a hydrogen ambient, for example, the silicon atoms on the surface migrate so that their surface energy is minimized. Based on these findings, Sato et al. have demonstrated that the geometry of empty spaces, such as spheres, plates and pipes, formed under the surface of a silicon substrate depends on the size, number and spacing of a plurality of cylindrical holes that are initially formed at a low temperature.

For example, FIGS. 1(a)–(f) illustrate how a single sphere-shaped empty space 13 is formed from a single cylindrical hole 12 formed within the silicon substrate 10.

Subsequent to the formation of the cylindrical hole 12, the silicon substrate 10 is annealed at a temperature lower than the melting point of monocrystalline silicon (1400° C.), for example, at a temperature of about 1100° C. Sato et al. have demonstrated that, within about 60 seconds and under a reducing ambient of 10 Torr of hydrogen, the shape and surface morphology of the cylindrical hole 12 changes drastically to that of the sphere-shaped empty space 13 (FIG. 1(f)). Because of the significant surface and/or volume diffusion which occurs at high annealing temperatures, the cylindrical hole 12 is unstable beyond a critical length Lc and transforms, therefore, to a lower energy state consisting of one or more empty spheres formed along the original cylinder axis.

As analyzed by Nichols et al., in *Surface-(Interface-) and Volume-Diffusion Contributions to Morphological Changes Driven by Capillarity*, Trans. AIME 233 at 1840 (Oct. 1965), the disclosure of which is incorporated by reference herein, when Lc corresponds to the surface diffusion state, the number N of empty spheres that form from a cylindrical hole depends both on the length L of the cylindrical hole and on the cylinder radius Rc. Accordingly, the number N of empty spheres formed from a cylindrical hole made in a silicon substrate could be estimated according to the following equation:

$$8.89Rc\ N<L<8.89Rc(N+1) \tag{1}$$

wherein: N=number of empty spheres;
Rc=cylinder radius; and
L=length of cylindrical hole Thus, equation (1) predicts that, if L<8.89 Rc, the number of empty spheres will be N=0, which means that no empty spheres will form from a cylindrical hole.

When one or more empty spheres form with a radius Rs, then according to Nichols et al., the value of Rs is given by the following equation:

$$Rs=1.88\ Rc \tag{2}$$

wherein: Rs=sphere radius; and
Rc=cylinder radius

Figure 3A:
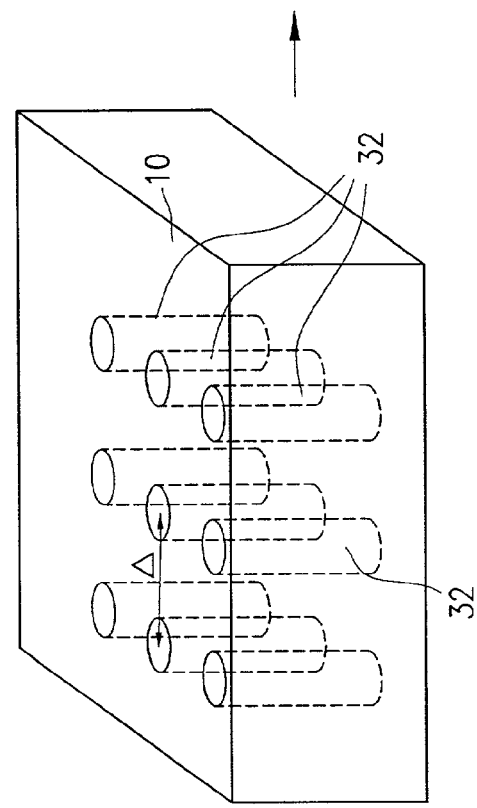
Figure 4:
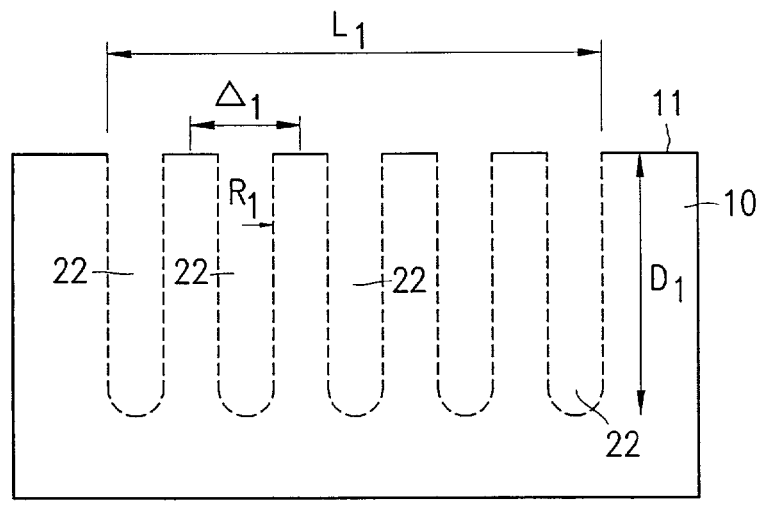
FIG. 4 is a cross-sectional view of the representative silicon structure of FIG. 2(a), taken along line 4–4', at an intermediate stage of processing and in accordance with a first embodiment of the present invention.

When two or more empty spheres form from a cylinder hole with a cylinder radius Rc, then the distance λ between the centers of two adjacent empty-spaced spheres is calculated from the following formula:

$$\lambda=8.89\ Rc \tag{3}$$

wherein: λ=center-to-center distance between two adjacent spheres; and
Rc=cylinder radius Reference is now made to FIGS. 2(a)–(c), which exemplify the formation of a single pipe-shaped empty space 23 from a linear array of cylindrical holes 22. Similarly, FIGS. 3(a)–(b) illustrate the formation of a single plate-shaped empty space 33 from a two-dimensional array of cylindrical holes 32 formed within a silicon substrate such as the silicon substrate 10. The values of the pipe radius Rp (of the pipe-shaped empty space 23) and that of the plate thickness Tp (of the plate-shaped empty space 33) may be calculated in a manner similar to that described above with reference to the formation of the empty sphere 13 and the calculation of sphere radius Rs in equation (2). The distance Δ between the centers of any two adjacent cylindrical holes 22, 32, in a linear array, may be calculated from the following formula:

$$2\ Rc<\Delta<3.76\ Rc \tag{4}$$

wherein: Rc=cylinder radius; and
Δ=center-to-center distance between two adjacent cylinder holes in a linear array Equation (4) ensures that adjacent cylindrical holes 22, 32 do not touch each other allowing, therefore, the formation of a plurality of adjacent spheres that combine to form the resulting pipe-shaped empty space 23 and plate-shaped empty space 33.

The values of the pipe radius Rp and of the plate thickness Tp are given by the following two expressions:

$$Rp=(8.86\ Rc^3/\Delta)^{1/2} \qquad (5)$$

$$Tp=27.83\ Rc^3/\Delta^2 \qquad (6)$$

wherein: Rp=pipe radius;
Tp=plate thickness; and
Δ=center-to-center distance between two adjacent cylinder holes in a linear array Reference is now made to FIG. 4 which, for simplicity, illustrates a cross-sectional view of structure of FIG. 2(a) on which a plurality of linear cylindrical holes 22 are drilled into silicon substrate 10 from an upper surface 11 of the substrate 10 to a depth D1. The silicon substrate 10 is annealed at a temperature of about 1100° C. and under a reducing ambient of about 10 Torr of hydrogen so that within about 60 seconds a pipe-shaped empty space 23 is formed within the silicon substrate 10 as shown in FIG. 5.

Radius R1 (FIG. 4) of each of the cylindrical holes 22 and distance Δ1 (FIG. 4) between the center of two adjacent cylindrical holes 22 may be calculated in accordance with equation (4). It must be understood that the length L1 (FIG. 4) of the array of the cylindrical holes 22 determines the length L1 (FIG. 5) of the pipe-shaped empty space 23, wherein the depth D1 (FIG. 4) to which the array of cylindrical holes 22 is drilled determines the depth D1 (FIG. 5) at which the pipe-shaped empty space 23 is formed. Both parameters define a location where a first level conductor 70 (FIGS. 13–14), will be formed as described in more detail below. Finally, the radius Rp of the pipe-shaped empty space 23 (FIG. 5) may be calculated in accordance with equation (5).

Figure 5:
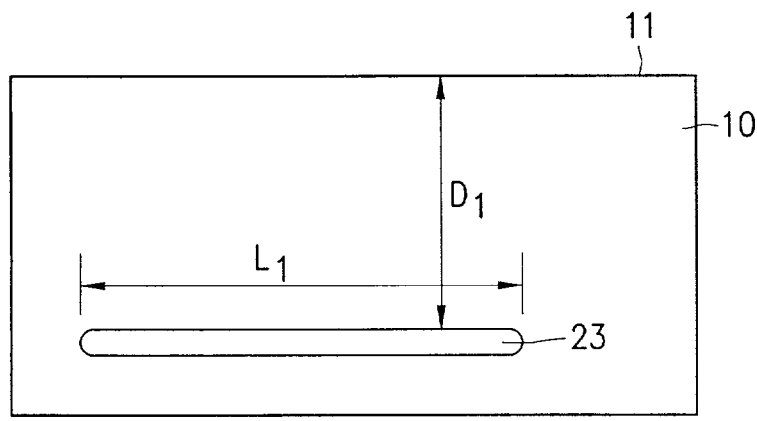
FIG. 5 is a cross-sectional view of the representative silicon structure according to the present invention at a stage of processing subsequent to that shown in FIG. 4.
Figure 6:
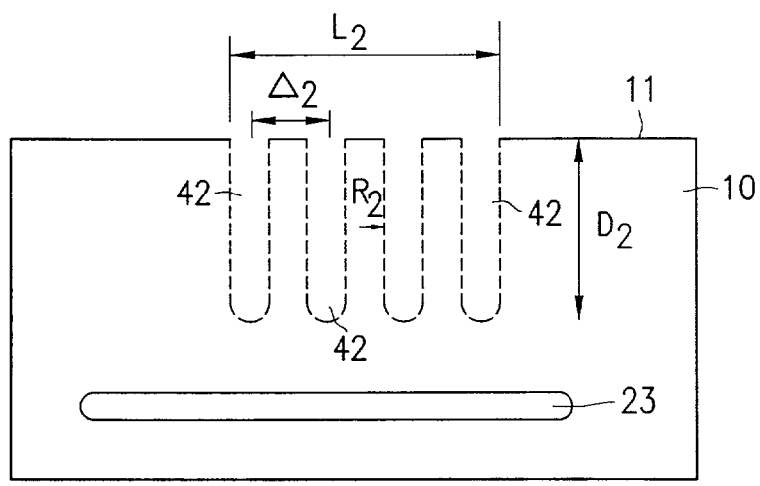
FIG. 6 is a cross-sectional view of the representative silicon structure according to the present invention at a stage of processing subsequent to that shown in FIG. 5.

Subsequent to the formation of the pipe-shaped empty space 23, a second pipe-shaped empty space 43 (FIG. 7) may be formed above the pipe-shaped empty space 23 and below the silicon surface 11 by a technique similar to that described for the formation of the pipe-shaped empty space 23 (FIG. 5). As such, a second linear array of cylindrical holes 42 (FIG. 6) are drilled into the silicon substrate 10 to a depth D2 to define the intended location, length and orientation of a second level conductor 80 (FIGS. 13–14), the formation of which will be described in more detail below. The silicon substrate 10 is then annealed at a temperature of about 1100° C. and under a reducing ambient of about 10 Torr of hydrogen, so that within about 60 seconds the second linear array of cylindrical holes 42 transforms into the second pipe-shaped empty space 43 (FIG. 7) by steps similar to those described above with reference to FIGS. 2(a)–(c).

Radius R2 (FIG. 6) as well as distance Δ2 (FIG. 6) between the center of two adjacent cylindrical holes 42 of the second linear array may be calculated in accordance to equation (4). Further, the length L2 (FIG. 6) of the second linear array of cylindrical holes determines the length L2 (FIG. 7) of the second pipe-shaped empty space 43, wherein the depth D2 (FIG. 6) to which the second linear array of cylindrical holes is drilled determines the depth D2 (FIG. 7) at which the second pipe-shaped empty space 43 is formed within the silicon substrate 10.

Figure 7:
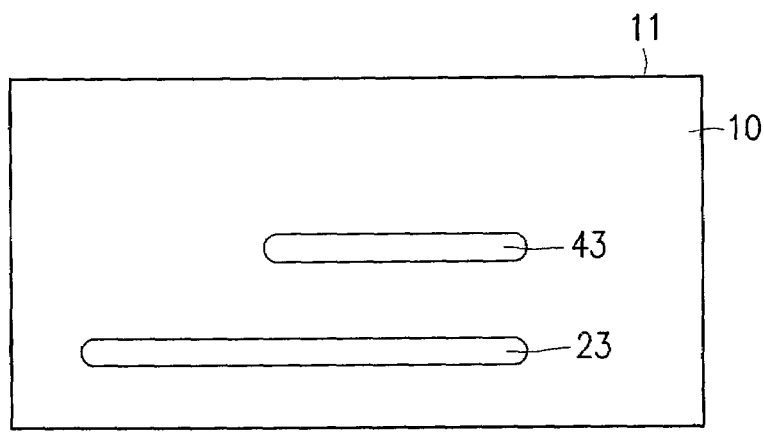
FIG. 7 is a cross-sectional view of the representative silicon structure according to the present invention at a stage of processing subsequent to that shown in FIG. 6.
Figure 8:
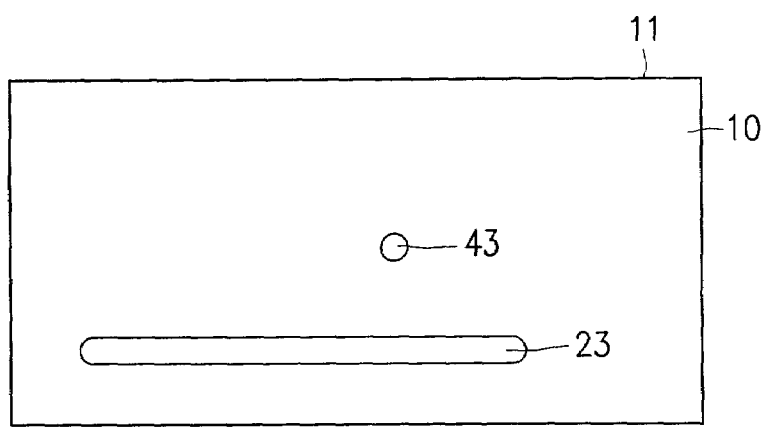
FIG. 8 is a cross-sectional view of the representative silicon structure according to a second embodiment of the present invention at a stage of processing subsequent to that shown in FIG. 6.

Although FIG. 7 illustrates the second pipe-shaped empty space 43 as being parallel to the pipe-shaped empty space 23, it must be understood that the second pipe-shaped empty space 43 need not be parallel to the pipe-shaped empty space 23 but may form various angles and may be placed in various directions with respect to the pipe-shaped empty space 23, according to the characteristics of the IC device to be formed. For example, FIG. 8 illustrates the second pipe-shaped empty space 43 forming a 90 degree angle with the pipe-shaped empty space 23.

Figure 9:
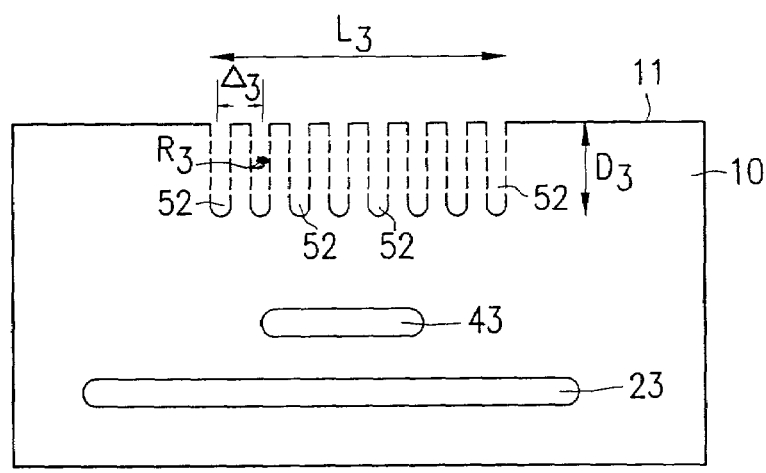
FIG. 9 is a cross-sectional view of the representative silicon structure according to the present invention at a stage of processing subsequent to that shown in FIG. 7.
Figure 10:
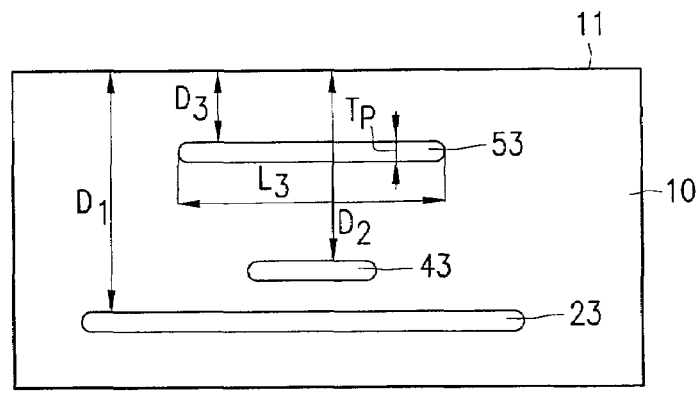
FIG. 10 is a cross-sectional view of the representative silicon structure according to the present invention at a stage of processing subsequent to that shown in FIG. 9.

FIG. 9 illustrates the formation of a two-dimensional array of cylindrical holes 52 located in between the upper silicon surface 11 and the second pipe-shaped empty space 43 which will form a plate-shaped empty space 53 (FIG. 10). Again, the silicon substrate 10 is annealed at a temperature of about 11000° C. and under a reducing ambient of about 10 Torr of hydrogen, so that within about 60 seconds the two-dimensional array of cylindrical holes 52 transforms into the plate-shaped empty space 53 (FIG. 10) by steps similar to those described above with reference to FIGS. 3(a)–(b). For a better understanding of the invention, the structures of FIG. 10 are illustrated in a three-dimensional view in FIG. 11.

Radius R3 (FIG. 9) as well as distance Δ3 (FIG. 9) between the center of two adjacent cylindrical holes 52 of the two-dimensional array may be calculated in accordance to equation (4). Further, the length L3 (FIG. 9) of the two-dimensional array of cylindrical holes determines the length L3 (FIGS. 10–11) of the plate-shaped empty space 53, wherein the depth D3 (FIG. 9) to which the two-dimensional array of cylindrical holes is drilled determines the depth D3 (FIGS. 10–11) at which the plate-shaped empty space 53 is formed within the silicon substrate 10. Finally, the thickness Tp (FIGS. 10–11) of the plate-shaped empty space 53 may be calculated in accordance with equation (6). This plate-shaped empty region may be left empty in some areas, so that the region above the plate becomes a silicon-over-nothing area where various IC devices can then be formed. Alternatively, the plate-shaped empty region may be also filled with a conductor, as it will be described in more detail below, to provide a plate-shaped conductor region.

Figure 12:
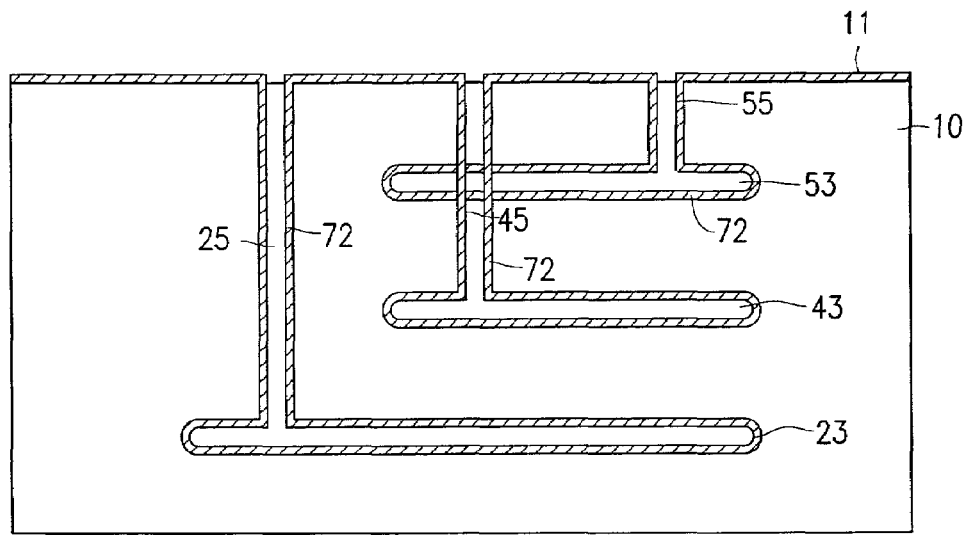
FIG. 12 is a cross-sectional view of the representative silicon structure according to the present invention at a stage of processing subsequent to that shown in FIG. 10.

Subsequent to the formation of the first pipe-shaped empty space 23, second pipe-shaped empty space 43, and plate-shaped empty space 53, additional interconnect structures and associated dielectric layers could be formed to create operative electrical paths down from the empty-spaced structures formed within the silicon substrate 10 and up to the silicon surfaces, such as the upper silicon surface 11, and any IC devices formed thereon. Accordingly, as illustrated in FIG. 12, a plurality of interconnect holes 25, 45, 55 are drilled within the silicon substrate 10 to connect each of the first pipe-shaped empty space 23, the second pipe-shaped empty space 43, and the plate-shaped empty space 53 with the upper silicon surface 11. The structure of FIG. 12 is then subjected to a conventional oxidizing atmosphere, for example an ozone oxidizing atmosphere or water vapor is heated and passed over the substrate at about 600–700° C., so that the inner surfaces of the above-described patterns, as well as the interconnect holes 24, 45, 55, are oxidized to prevent any leakage between conductors formed in areas 23, 43, 53, the substrate and any active devices that will be eventually fabricated over the silicon substrate 10.

Alternatively, or in addition to the oxidizing atmosphere, a barrier layer 72 may be formed on surfaces of the silicon substrate 10, within each of the interconnect holes 24, 45, 55, and on the inner surfaces of each of the first pipe-shaped empty space 23, the second pipe-shaped empty space 43, and the plate-shaped empty space 53, as also shown in FIG. 12. The barrier layer 72 may be formed by CVD, PVD, sputtering or evaporation, to a thickness of about 50 Angstroms to about 100 Angstroms.

Preferred materials for the barrier layer 72 are metals, such as titanium (Ti), zirconium (Zr), tungsten (W), or hafnium (Hf), or metal compounds, such as tantalum nitride (TaN) or silicon nitride ($Si_3N_4$). If desired, the barrier layer 72 may be formed of refractory metal compounds, such as refractory metal nitrides (for example TiN and HfN), refractory metal carbides (for example TiC or WC), or refractory metal borides (for example TiB or MoB). The selection of a material for the barrier layer 72 depends upon the specific conductor to be deposited and the method which is chosen to deposit such conductor. In turn, the selection of the conductor material will depend upon the type and temperature of subsequent processing steps. For example, aluminum (Al) would not be chosen as the conductor material if the subsequent processing steps require temperatures above approximately 600° C. Similarly, tungsten (W) would be a preferred conductor for temperatures above approximately 1,000° C. In any event, the barrier layer 72 suppresses the diffusion of the metal atoms from the subsequently deposited conductive material (FIG. 13), while offering a low resistivity and low contact resistance between the subsequently deposited conductive material (FIG. 13) and the barrier layer 72.

Although in an exemplary embodiment of the invention the barrier layer 72 is simultaneously deposited in the interconnect holes 24, 45, 55, and on the inner surfaces of each of the first pipe-shaped empty space 23, the second pipe-shaped empty space 43, and the plate-shaped empty space 53, the invention is not limited to this embodiment. For example, the barrier layer 72 may be deposited first in the interconnect hole 24 and its corresponding pipe-shaped empty space 23, before the formation of the interconnect hole 45 and its corresponding second pipe-shaped empty space 43, and before the formation of the interconnect hole 55 and its corresponding plate-shaped empty space 53. In this embodiment, the barrier layer 72 may be formed of a first barrier material corresponding to the pipe-shaped empty space 23, of a second barrier material corresponding to the second pipe-shaped empty space 43, and of a third barrier material corresponding to the plate-shaped empty space 53. The first, second and third barrier materials may be the same or different, depending on the characteristics of the IC device.

Figure 13:
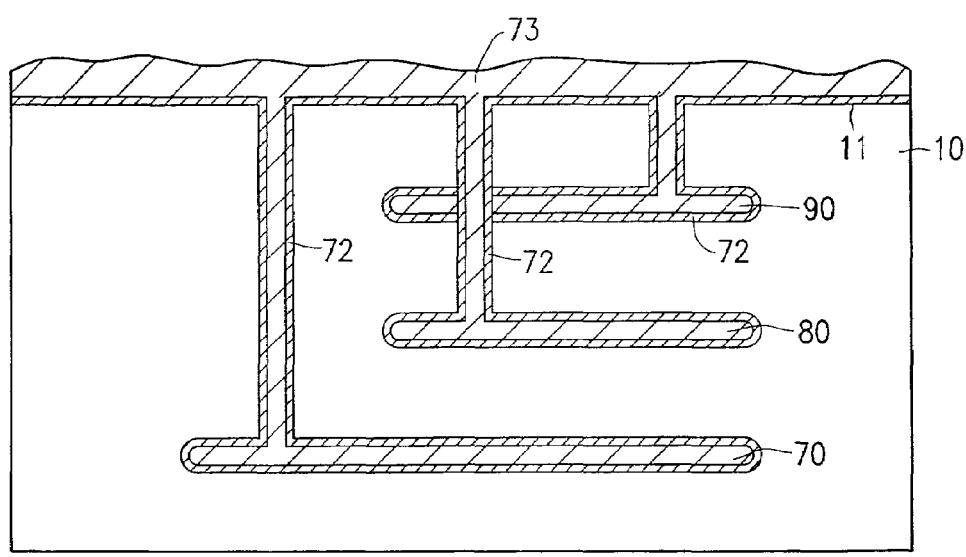
FIG. 13 is a cross-sectional view of the representative silicon structure according to the present invention at a stage of processing subsequent to that shown in FIG. 12.

As illustrated in FIG. 13, a conductive material 73 is next deposited to fill in the interconnect holes 24, 45, 55, as well as the first pipe-shaped empty space 23, the second pipe-shaped empty space 43, and the plate-shaped empty space 53. In a preferred embodiment of the invention, the conductive material 73 comprises either copper, silver, gold, tungsten or aluminum, but it must be understood that other conductive materials and/or their alloys may be used also. In any event, the conductive material 73 may be blanket deposited by a substitution technique, as described in U.S. Pat. Nos. 5,920,121; 6,100,176; 6,121,126, and U.S. application Ser. No. 09/069,346 filed Apr. 29, 1998 (disclosure of which is incorporated by reference). Alternatively, the conductive material 73 may be also blanket deposited by a known PVD, CVD, or a combination of these techniques to fill in all three interconnect holes 24, 45, 55 and their associated first pipe-shaped empty space 23, second pipe-shaped empty space 43, and plate-shaped empty space 53 to form a first buried conductor pattern 70, a second buried conductor pattern 80, and a third buried conductor pattern 90, all illustrated in FIG. 13. Alternatively, the conductive material 73 may be deposited by a plating technique.

Figure 14:
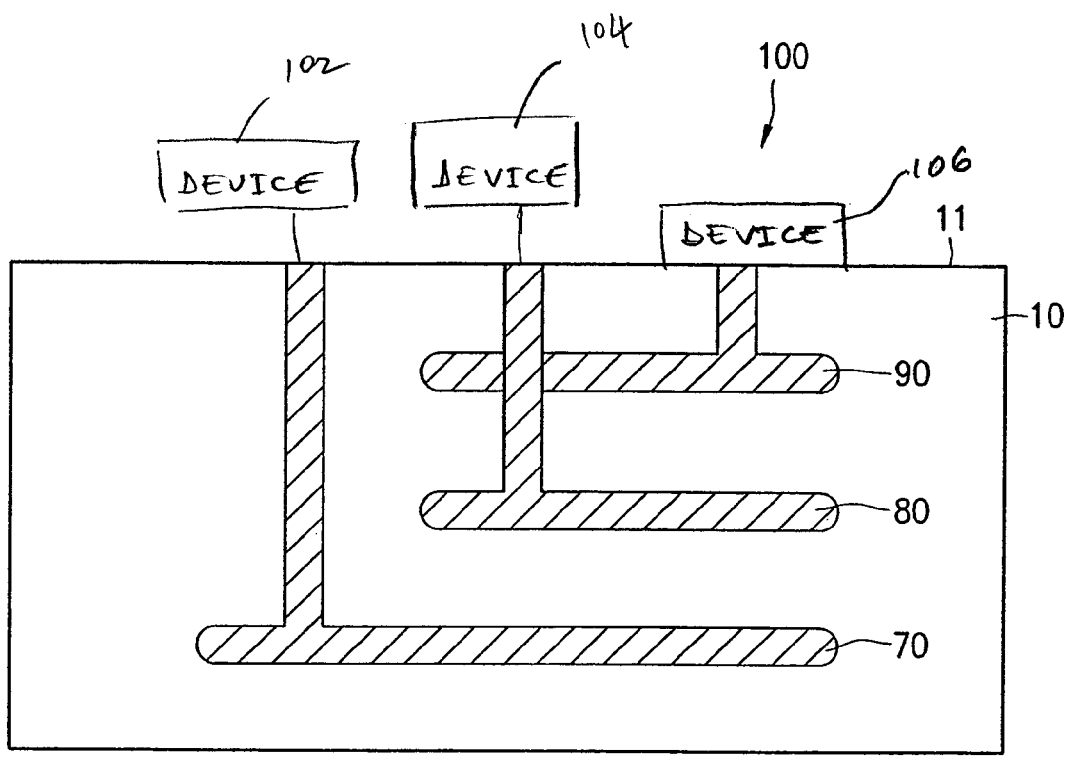
FIG. 14 is a cross-sectional view of the representative silicon structure according to the present invention at a stage of processing subsequent to that shown in FIG. 13.

After the deposition of the conductive material 73, excess barrier material and excess metal formed above the upper silicon surface 11 may be removed by either an etching or a polishing technique to form the buried silicon structure 100 illustrated in FIG. 14. In an exemplary embodiment of the present invention, chemical mechanical polishing (CMP) is used to polish away excess barrier and conductive materials above the upper silicon surface 11 of the silicon substrate 10.

Although the buried silicon structure 100 is shown in FIG. 14 as comprising only three buried conductor patterns 70, 80, and 90, respectively, it must be readily apparent to those skilled in the art that in fact any number of such buried conductor patterns may be formed in the substrate 10, as pipes, plates, or spheres, by methods of the present invention. Also, although the exemplary embodiments described above refer to the formation of buried conductor patterns having specific shapes, it must be understood that other shapes, configurations or geometries may be employed, depending on the characteristics of the particular IC device to be fabricated. For example, as shown in FIG. 14A, a buried silicon structure 101 may comprise three buried conductor patterns 71, 81, and 91, which may be pipe-shaped, sphere-shaped, and plate-shaped, respectively. Further, the invention is not limited to a combination of three buried conductor patterns, but any combination of any number of empty-spaced patterns filled with a conductor may be employed, as desired.

Figure 11:
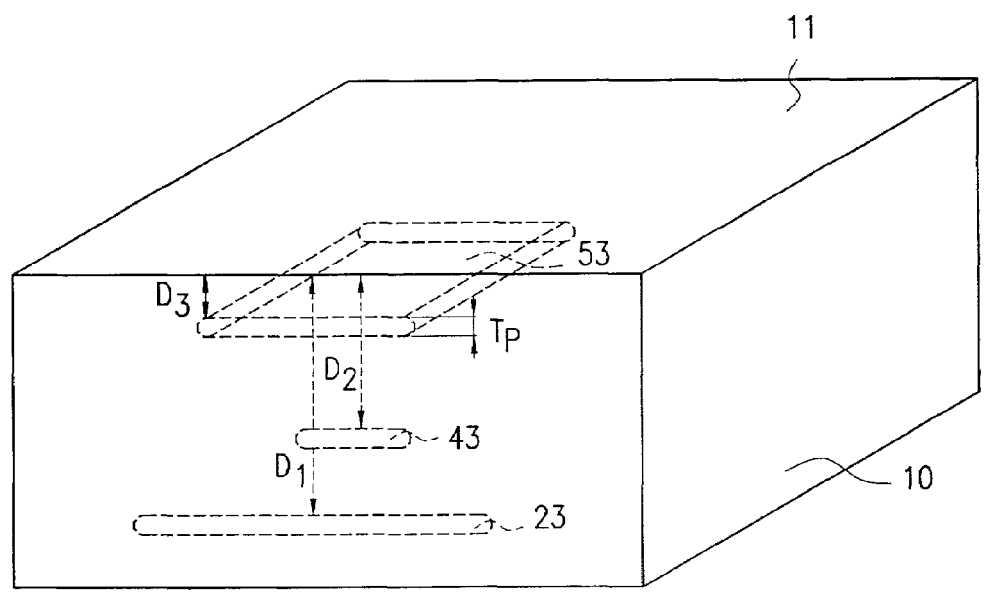
FIG. 11 is a three-dimensional view of the representative silicon structure of FIG. 10

The processing steps of the present invention may be also reduced if the lower level buried conductor patterns do not cross over each other below upper level buried patterns, such as the plate-shaped empty space 53 (FIGS. 10–12). In this case, all buried conductor patterns located below the plate-shaped empty space 53 may be simultaneously formed during the same annealing/heating cycle, to reduce therefore the number of processing steps during the fabrication of the buried silicon structure 100.

In addition, further steps to create a functional memory cell on the silicon substrate 10 may be carried out. Thus, additional multilevel interconnect layers and associated dielectric layers could be formed to create operative electrical paths from the buried silicon structure 100 to a source/drain region (not shown) adjacent to a transistor gate structure (not shown) of the substrate 10, or to any active devices 102, 104, 106 (FIG. 14) which will be eventually fabricated over the substrate 10. The substrate containing the buried conductors can be used in the formation of many types of integrated circuits such as memories, for example, DRAMs, processors etc.

The invention thus provides a technique for forming buried conductors in a semiconductor, for example, silicon, substrate which may be used for example as interconnects to various structures and devices in an integrated circuit.

Figure 15:
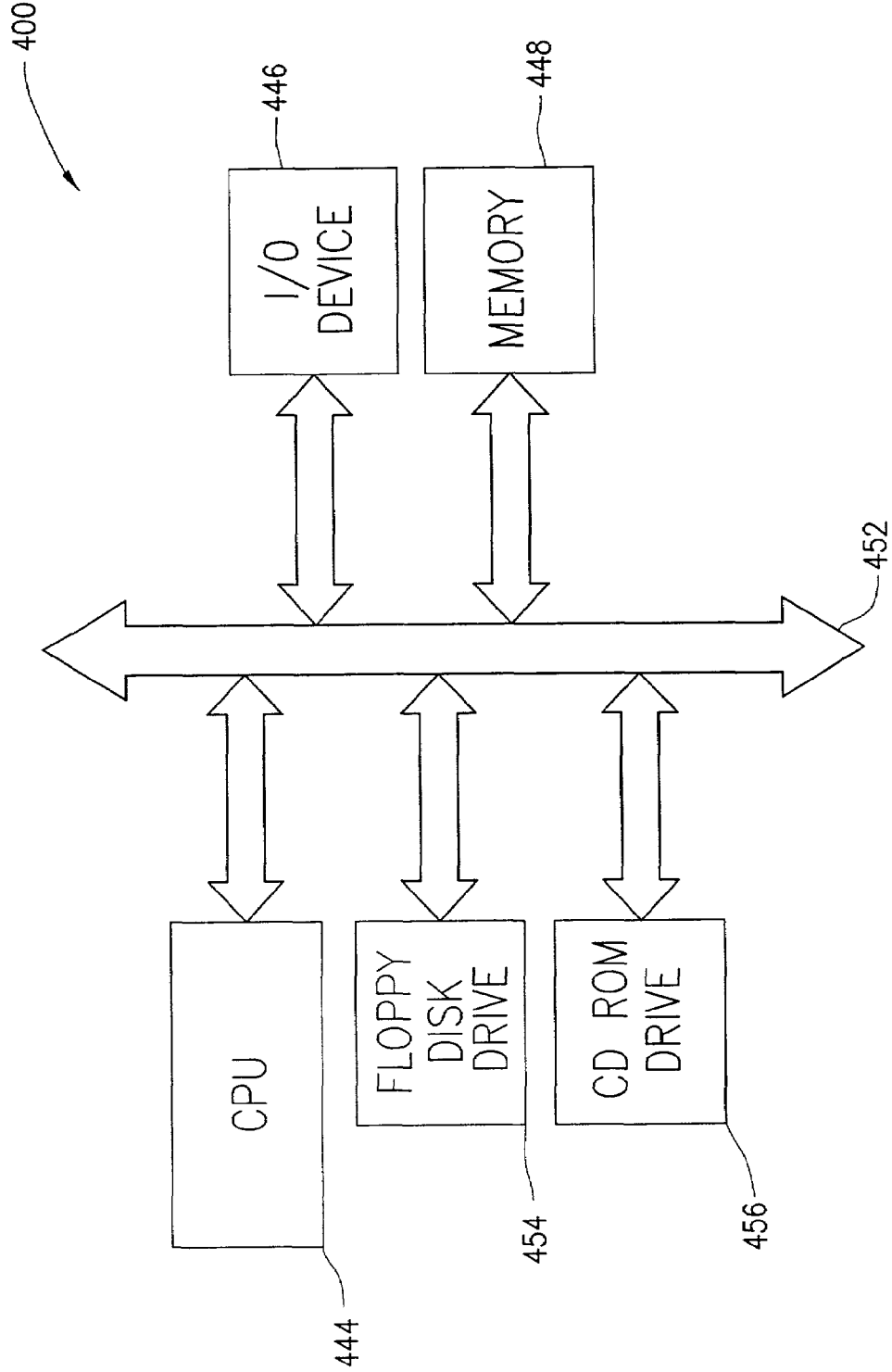
FIG. 15 is a schematic diagram of a processor system incorporating a silicon structure of the present invention.

A typical processor-based system 400 which includes a memory circuit 448, for example a DRAM, is illustrated in FIG. 15. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448, the CPU 444 or others of the illustrated electrical structures may be constructed as an integrated circuit, which includes one or more buried silicon structures 100 in accordance with the invention. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An integrated circuit substrate comprising at least one buried conductor pattern provided within a monocrystalline substrate such that said buried conductor pattern is below a top surface of said substrate and said buried conductor pattern is completely surrounded by the same monocrystalline substrate material of a same conductivity type of said monocrystalline substrate, said at least one buried conductor pattern forming at least a part of an interconnect between devices, and a conductive path extending from said buried conductor pattern to said devices, wherein at least a portion of said conductive path extends below said top surface of said substrate.

2. The integrated circuit of claim 1, further comprising a second buried conductor pattern having a pipe-shaped pattern.

3. The integrated circuit of claim 1, further comprising a second buried conductor pattern having a plate-shaped pattern.

4. The integrated circuit of claim 1, wherein said at least one buried conductor pattern is formed of a material selected from the group consisting of copper, copper alloy, silver, silver alloy, gold, gold alloy, tungsten, tungsten alloy, aluminum and aluminum alloy.

5. The integrated circuit of claim 1, wherein said monocrystalline substrate is a silicon substrate.

6. The integrated circuit of claim 1, wherein said monocrystalline substrate is a germanium substrate.

7. The integrated circuit of claim 1, wherein said monocrystalline substrate is a silicon-on-insulator substrate.

8. The integrated circuit of claim 1, wherein said monocrystalline substrate is a silicon-on-nothing substrate.

9. A buried conductor pattern within a monocrystalline substrate, comprising:
at least one empty-spaced pattern in said monocrystalline substrate formed by annealing said substrate containing at least one hole drilled therein;
a conductive material filling said empty space pattern such that said conductive material is below a top surface of said monocrystalline substrate and forms a buried conductor pattern, said buried conductor pattern being completely surrounded by the same monocrystalline substrate material of a same conductivity type of said monocrystalline substrate, said buried conductor pattern forming at least a part of an interconnect between devices; and
a conductive path connecting said buried conductor pattern with the exterior of said monocrystalline substrate, wherein at least a portion of said conductive path extends below said top surface of said substrate.

10. The buried conductor pattern of claim 9, wherein said empty-spaced pattern has a pipe-shaped configuration.

11. The buried conductor pattern of claim 9, wherein said empty-spaced pattern has a plate-shaped configuration.

12. The buried conductor pattern of claim 9, wherein said empty-spaced pattern has a sphere-shaped configuration.

13. A processor system comprising:
a processor; and
a circuit coupled to said processor, at least one of said circuit and processor comprising:
a conductive structure comprising a monocrystalline substrate having at least one empty space pattern formed by annealing said monocrystalline substrate having at least one hole drilled therein;
a conductive material filling said empty space pattern such that said conductive material is below a top surface of said monocrystalline substrate and said conductive structure is completely surrounded by the same monocrystalline substrate material of a same conductivity type of said monocrystalline substrate, said conductive structure forming at least a part of an interconnect between devices; and
a conductive path extending from said conductive structure to said top surface of said monocrystalline substrate, wherein at least a portion of said conductive path extends below said top surface of said substrate.

14. The processor based system of claim 13, wherein said empty-spaced pattern has a pipe-shaped configuration.

15. The processor system of claim 13, wherein said empty-spaced pattern has a plate-shaped configuration.

16. The processor system of claim 13, wherein said empty-spaced pattern has a sphere-shaped configuration.

17. The processor system of claim 13, wherein said circuit is a memory circuit.

18. The processor system of claim 13, wherein said circuit is a DRAM memory circuit.

19. The processor system of claim 13, wherein said circuit and said processor are integrated on same circuit.

20. The processor system of claim 13, wherein said processor comprises said conductive structure.

21. The processor system of claim 13, wherein said circuit comprises said conductive structure.

22. An integrated circuit substrate comprising a plurality of buried conductor patterns provided within a monocrystalline substrate such that said buried conductor patterns are below a top surface of said substrate and said buried conductor patterns are completely surrounded by the same monocrystalline substrate material of said monocrystalline substrate, said buried conductor patterns forming at least a part of an interconnect between devices, and a conductive path extending from each of said buried conductor patterns, wherein at least a portion of said conductive path extends below said top surface of said substrate.

23. The integrated circuit of claim 22 wherein at least one of said plurality of buried conductor patterns has a pipe-shaped pattern.

24. The integrated circuit of claim 23 wherein at least one of said plurality of buried conductor patterns has a spherical pattern.

25. An integrated circuit substrate comprising first and second buried conductor patterns provided within a monocrystalline substrate such that said buried conductor patterns are below a top surface of said substrate and said buried conductor patterns are completely surrounded by the same monocrystalline material of a same conductivity type of said monocrystalline substrate, said first and second buried conductive patterns forming at least a part of first and second interconnects between devices, respectively, wherein said first buried conductor pattern is located below said second buried conductor pattern and relative to said surface of said monocrystalline substrate, and a first conductive path extending from said first buried conductor pattern and a second conductive path extending from said second buried conductor pattern, wherein at least a portion of said conductive paths extend below said top surface of said substrate.

26. The integrated circuit of claim 25, further comprising a third buried conductor pattern located below said first and second buried conductor patterns and relative to a surface of said monocrystalline substrate and a third conductive path extending from said third buried conductor pattern.

27. The integrated circuit of claim 26, wherein one of said buried conductor patterns has a pipe-shaped pattern.

28. The integrated circuit of claim 26, wherein one of said buried conductor patterns has a plate-shaped pattern.

29. The integrated circuit of claim 26, wherein one of said buried conductor patterns has a spherical pattern.

30. The integrated circuit of claim 26, wherein said buried conductor patterns are formed of a conductive material selected from the group consisting of copper, copper alloy, silver, silver alloy, gold, gold alloy, tungsten, tungsten alloy, aluminum and aluminum alloy.

* * * * *